či(12) United States Patent
Cosemans et al.

(10) Patent No.: US 10,593,395 B2
(45) Date of Patent: Mar. 17, 2020

(54) MULTIPLE DATA RATE MEMORY

(71) Applicant: SURECORE LIMITED, Leeds (GB)

(72) Inventors: Stefan Cosemans, Leeds (GB); Bram Rooseleer, Leeds (GB)

(73) Assignee: SURECORE LIMITED, Sheffield (GB)

( * ) Notice: Subject to any disclaimer, the term of this patent is extended or adjusted under 35 U.S.C. 154(b) by 0 days.

(21) Appl. No.: 16/081,480

(22) PCT Filed: Feb. 28, 2017

(86) PCT No.: PCT/GB2017/050540
§ 371 (c)(1),
(2) Date: Aug. 31, 2018

(87) PCT Pub. No.: WO2017/149295
PCT Pub. Date: Sep. 8, 2017

(65) Prior Publication Data
US 2019/0103155 A1 Apr. 4, 2019

(30) Foreign Application Priority Data

Mar. 1, 2016 (GB) .................................. 1603590.9

(51) Int. Cl.
*G11C 7/10* (2006.01)
*G11C 11/419* (2006.01)
(Continued)

(52) U.S. Cl.
CPC ............ *G11C 11/419* (2013.01); *G11C 7/062* (2013.01); *G11C 7/065* (2013.01); *G11C 7/067* (2013.01);
(Continued)

(58) Field of Classification Search
CPC ...... G11C 7/222; G11C 7/1078; G11C 7/1084
(Continued)

(56) References Cited

U.S. PATENT DOCUMENTS 6,091,629 A * 7/2000 Osada ................. G06F 12/0802
365/156
2006/0280022 A1 12/2006 Kono et al.
(Continued)

OTHER PUBLICATIONS

International Search Report and Written Opinion dated May 8, 2017, from International Application No. PCT/GB2017/050540, 12 pages.
(Continued)

*Primary Examiner* — Hoai V Ho
*Assistant Examiner* — Minh Dinh
(74) *Attorney, Agent, or Firm* — Meunier Carlin & Curfman LLC

(57) ABSTRACT

There is provided a multiple data rate memory configured to implement first and second memory accesses within a single cycle of an external clock signal. The memory comprises a plurality of memory cell groups, each memory cell group comprising a plurality of memory cells that are each operatively connected to at least one local bit line, the at least one local bit line of each memory cell group being connected to a local-to-global interface circuit. The local-to-global interface circuit is configured to control the state of at least one first global bit line in dependence upon the state of the at least one local bit line during the first memory access and to control the state of at least one second global bitline in dependence upon the state of the at least one local bit line during the second memory access.

25 Claims, 9 Drawing Sheets

(51) Int. Cl.
*G11C 7/06* (2006.01)
*G11C 7/08* (2006.01)
*G11C 7/12* (2006.01)
*G11C 7/18* (2006.01)
*G11C 7/22* (2006.01)
*G11C 8/16* (2006.01)

(52) U.S. Cl.
CPC .............. *G11C 7/08* (2013.01); *G11C 7/1072* (2013.01); *G11C 7/12* (2013.01); *G11C 7/18* (2013.01); *G11C 7/22* (2013.01); *G11C 8/16* (2013.01); *G11C 2207/005* (2013.01)

(58) Field of Classification Search
USPC ............................................ 365/189.03, 230
See application file for complete search history.

(56) References Cited

U.S. PATENT DOCUMENTS

2010/0054011 A1* 3/2010 Kim .................... G11C 7/1048
365/49.17
2013/0148415 A1 6/2013 Shu et al.

OTHER PUBLICATIONS

Written Opinion of the International Preliminary Examining Authority dated Jan. 31, 2018, from International Application No. PCT/GB2017/050540, 6 pages.

International Preliminary Report on Patentability dated May 14, 2018, from International Application No. PCT/GB2017/050540, 18 pages.

* cited by examiner

MULTIPLE DATA RATE MEMORY

TECHNICAL FIELD

The present invention relates to multiple data rate memory providing digital data storage. In particular, the present invention provides an improved memory unit that can demultiplex data read from the memory cells within the memory at a multiple data rate onto separate global bit lines.

BACKGROUND

Data storage is an essential requirement for virtually all modern digital electronic systems. Static read/write memory (SRAM) comprises a major part of that function, being relatively easy to integrate into a semiconductor device together with large amounts of logic, thus offering fast access and low power. With the advent of deep sub-micron (DSM) geometry silicon processing, the task of implementing reliable storage whilst simultaneously maintaining low power consumption becomes increasingly problematic, whilst conversely demand rises with the proliferation of battery-powered electronic gadgets requiring progressively larger memories.

The most commonly-used design of SRAM memory cell is the 6-transistor circuit shown in FIG. 1 and consists of a storage element made up of two back-to-back/cross-coupled inverters ([MN1, MP1] and [MN2, MP2]) 11a, 11b, 12a, 12b with access transistors (MA1 and MA2) 16a, 16b which are turned ON by means of a word line control (WL) to form a conducting path between the data storage nodes (N1 and N2) 13, 14 of the cell and the complementary bit lines (BLA and BLB).

A write operation, in which a data value is written to a memory cell, is achieved by forcing a high voltage onto one of BLA or BLB whilst simultaneously forcing a low voltage onto the other, and then driving the word line (WL) high to activate the access path allowing the voltage levels held on the bit lines (BLA and BLB) to overcome the state of the storage element. The word line is then driven low to disconnect the memory cell with its data store held in its new state.

A read operation in which a data value stored in a memory cell is read, is achieved by initially driving both bit lines to a notionally high voltage level before then driving the word line (WL) high. One of either BLA or BLB will then be pulled low through the access devices (MA1 and MA2) by the low voltage side of the storage element. The complementary bit lines are attached to inputs of a sense amplifier (not shown) that is part of the read circuitry which is used when data is read from the memory. A sense amplifier senses the low level signals present on the bit lines which represent the data value (i.e. either a '1' or a '0') stored in a given memory cell, and amplifies the small voltage swing to recognisable logic level so that the data can be interpreted properly by logic outside the memory. The difference in voltage levels between the two bit lines can therefore be sensed by the sense amplifier and used to determine the data value (i.e. '1' or '0'). The decision levels representing a '1' and a '0' will have been pre-determined during the circuit design phase and applied by the sense amplifier.

FIG. 2 illustrates a conventional memory unit wherein the memory cells are arranged in a two-dimensional array consisting of horizontal rows and vertical columns. Each memory cell in the array is connected to a word line that runs horizontally across a row of the array and to a pair of bit lines that run vertically within the columns. By convention the word lines are always said to run along the rows of an array of memory cells whilst the bit lines are always said to run down the columns of an array of memory cells, irrespective of the orientation of the array. The word lines are driven by a row decoder that takes an m-bit address and produces $2^m$ word line enable signals. Each pair of bit lines is then driven by a column decoder that takes an n-bit address and produces $2^n$ bit line signals.

In order to reduce delay and power dissipation, a number of different partitioning approaches have been used in which the memory array is partitioned into a number of smaller blocks that can be separately accessed. In particular, it is common for a memory array to be partitioned by the use of divided/hierarchical word lines and divided/hierarchical bit lines.

In a hierarchical word line arrangement, instead of a single word line that runs the complete width of a row of memory cells and connects to each cell in the row, a multi-level structure is used. Effectively, a single word line is broken up into multiple "local word lines", each of which connects to a group of memory cells in a part of a row of the array. A "global word line" then runs the width of the row and is connected to each of the local word lines in that column via gates/switches.

Similarly, in a hierarchical bit line arrangement in which, instead of a single bit line that runs the complete height of a column of memory cells and connects to each cell in the column, another multi-level structure is used. Effectively, a single bit line is broken up into multiple "local bit lines", each of which connects to a group of memory cells in a part of a column of the array. A "global bit line" also runs the height of the column, and is connected to each of the local bit lines in that column via an interface circuit. The memory read and write circuits connect to the global bit line, and not directly to the local bit line. During a memory access, only a local bit line in the relevant part of the column is connected to the global bit line.

One crucial part of the design of the 6-transistor memory cell is the drive strength ratios of the NMOS (n-channel metal-oxide semiconductor field effect transistor) pull down transistors (MN1 and MN2), the NMOS access devices (MA1 and MA2) and the PMOS (p-channel metal-oxide semiconductor field effect transistor) pull up devices (MP1 and MP2). In particular, the access devices need to be sufficiently large relative to the pull-up devices to guarantee that the cell state is over-written during a write, but not so large (relative to the pull-down devices) that the cell becomes over-loaded and unstable during a read thereby causing the stored data value to be lost.

The act of reading a 6-transistor memory cell therefore presents its most challenging operating condition for retaining its data whilst the storage elements are loaded via the access devices (i.e. access devices turned on and both bit lines high). With the inevitable degree of random device variability suffered on DSM technologies due to the very small geometry of the individual devices, simultaneously meeting both writability and read stability criteria on all cells in a very large memory (10's of millions of bits) becomes extremely challenging.

In order to alleviate the difficulty of addressing these conflicting requirements simultaneously, an increasingly common practice is to use memory cells that have dedicated read ports, often referred to as read-decoupled memory cells, that provide a path for accessing a memory cell during a read operation that is separate to that used for write operations. FIGS. 3 and 4 illustrate two different examples of read-decoupled memory cells.

FIG. 3 shows an 8-transistor cell design that separates out the write and read paths of the circuit by the addition a single-ended read port. The single-ended read port comprises a data read transistor (MDR) is connected to a storage node (N2) of the memory cell and a read access transistor (MAR) that is controlled by an associated read word line (RWL). The read word line (RWL) is separate/distinct from the word line (WL) that controls access to the memory cell during a write operation. The NMOS data read transistor (MDR) is configured as a pull-down transistor whose gate is connected to the storage node of the memory cell and whose source is connected to ground. The data read transistor (MDR) is connected in series with the NMOS read access transistor (MAR) whose gate is connected to the read word line (RWL) and whose drain is connected to a read bit line (RBL). The read access transistor (MAR) can thereby provide a conducting path between the data storage node (N2) of the cell and the read bit line (RBL). Write operations on this 8-transistor cell design are identical to those for the 6-transistor cell. For reads, however, instead of the write word line (WWL) being driven high, the single read bit line (RBL) is initially pre-charged to a high voltage and then the read word line (RWL) driven high. That enables the data-dependent discharge path from the read bit line (RBL) through the cell to VSS, and so the read bit line (RBL) will either stay high (due to its capacitance) or be pulled low by the cell. The state of the read bit (RBL) line can then be sensed to determine the data value stored in the selected bit. Whilst this example shows a read-decoupled memory cell comprising conventional 6-transistor cell with the addition of one single-ended read port, it is possible to include multiple single-ended read ports within a single cell.

FIG. 4 shows an alternative 8-transistor cell design that separates out the write and read paths of the circuit by the addition a differential/double-ended read port. The differential/double-ended read port comprises a first read access transistor (MAR1) connecting a first storage node (N1) of the memory cell to a first (RBLA) of a pair of complementary read bit lines, and a second read access transistor (MAR2) connecting a second storage node (N2) of the memory cell to a second (RBLB) of the pair of complementary read bit lines. The differential/double-ended read port therefore essentially replicates the access transistors of a conventional 6-transistor cell (i.e. that control the connection of the complementary bit lines to the storage nodes) so that there are separate yet corresponding write and read paths for the cell. As with a conventional 6-transistor cell, during a write operation, the write access transistors (MA1 and MA2) are turned on by means of a write word line to form a conducting path between the data storage nodes (N1 and N2) of the cell and the complementary bit lines (BLA and BLB). Then, during a read operation, the first and second read access transistors (MAR1 and MAR2) are turned on by means of a read word line control (RWL) to form a conducting path between the data storage nodes (N1 and N2) of the cell and the complementary read bit lines (RBLA and RBLB). This design allows the access devices to be sized differently for read and write operations to allow more flexible optimisation, but the internal nodes are still stressed by a read operation.

Conventionally, an SRAM memory performs one access operation (read or write) per cycle (rise and fall) of a clock signal. This, however, requires that the clock signal changes twice per access, while the data lines change at most once per access. When operating at a high bandwidth, system considerations often constrain the frequency at which the clock single can operate. However, it is possible for the memory circuits to operate at multiple data rates, wherein multiple accesses occur within a single cycle of an external clock signal. For example, the memory circuits can be configured to implement access operations on both the rising and falling edges of the external clock such that the data signals operate with the same limiting frequency, thereby doubling the data transmission rate.

SUMMARY

In the hierarchical bit line arrangement described above, the local bit lines are connected to one or more global bit line by an interface circuit. It is therefore desirable to provide a local-to-global interface circuit that has a very short cycle time in order to be able to achieve multiple data rate read operations without the need for the global bit lines to operate at multiple data rates. The present inventors have therefore developed a multiple data rate memory in which the local-to-global interface circuits can demultiplex data read from the memory cells within the memory at a multiple data rate onto separate global bit lines.

Therefore, according to a first aspect of the present invention there is provided a multiple data rate memory configured to implement first and second memory accesses within a single cycle of an external clock signal. The memory comprises a plurality of memory cell groups, each memory cell group comprising a plurality of memory cells that are each operatively connected to at least one local bit line, the at least one local bit line of each memory cell group being connected to a local-to-global interface circuit. The local-to-global interface circuit is configured to control the state of at least one first global bit line in dependence upon the state of the at least one local bit line during the first memory access and to control the state of at least one second global bit line in dependence upon the state of the at least one local bit line during the second memory access.

Each of the plurality of memory cells within a memory cell group is preferably associated with a wordline that controls the connection of the memory cell to the at least one local bit line. The associated wordline is then connected to a wordline driver that provides a multiple data rate wordline signal.

Preferably, the multiple data rate memory comprises a pre-charge circuit configured to provide a voltage for charging the first and second local bit lines, wherein the pre-charge circuit is further configured to charge the first and second local bit lines at the multiple data rate.

Each of the plurality of memory cells within a memory cell group may be operatively connected to a pair of local bit lines. The local-to-global interface circuit may then be configured to control the state of a pair of first global bit lines in dependence upon the state of the pair of local bit lines during the first memory access, and to control the state of a pair of second global bit lines in dependence upon the state of the pair of local bit lines during the second memory access.

The local-to-global interface circuit may comprise a local sense amplifier, the local sense amplifier being configured to control the state of the pair of first global bit lines in dependence upon the state of the pair of local bit lines during the first memory access and to control the state of the pair of second global bit lines in dependence upon the state of the pair of local bit lines during the second memory access.

The local-to-global interface circuit may alternatively comprise a first local sense amplifier and a second local sense amplifier, the first local sense amplifier being configured to control the state of the pair of first global bit lines in dependence upon the state of the pair of local bit lines during the first memory access, and the second local sense amplifier being configured to control the state of the pair of second global bit lines in dependence upon the state of the pair of local bit lines during the second memory access.

Each local sense amplifier may comprise a latch-type sense amplifier with pass transistors that is enabled during a memory access, wherein the pass transistors control the connection of the latch-type sense amplifier to a pair of local bit lines and are configured to connect the latch-type sense amplifier to the local bit lines when the latch-type sense amplifier is disabled and to disconnect the latch-type sense amplifier from the local bit lines when the latch-type sense amplifier is enabled. Each latch-type sense amplifier preferably comprises a pair of cross-coupled inverters having respective first and second sense nodes, the first sense node being connected to a gate of a first pullup transistor that is connected to a first of the pair of global bit lines, and the second sense node being connected to a gate of second pullup transistor that is connected to a second of the pair of global bit lines.

The local-to-global interface circuit may be configured to control the state of a first global bit line in dependence upon the state of a first of the pair of local bit lines during the first memory access, and to control the state of a second global bit line in dependence upon the state of the first of the pair of local bit lines during the second memory access.

The local-to-global interface circuit may be further configured to control the state of a third global bit line in dependence upon the state of a second of the pair of local bit lines during the first memory access, and to control the state of a fourth global bit line in dependence upon the state of the second of the pair of local bit lines during the second memory access.

The local-to-global interface circuit may comprise a first local read buffer and a second local read buffer, the first local read buffer being configured to control the state of a first global bit line in dependence upon the state of the first of the pair of local bit lines during the first memory access, and the second local read buffer being configured to control the state of the second global bit line in dependence upon the state of the first of the pair of local bit lines during the second memory access.

The local-to-global interface circuit may further comprise a third local read buffer and fourth local read buffer, the third local read buffer being configured to control the state of a third global bit line in dependence upon the state of a second of the pair of local bit lines (during the first memory access, and the fourth local read buffer being configured to control the state of a fourth global bit line in dependence upon the state of the second of the pair of local bit lines during the second memory access.

The local-to-global interface circuit may comprise a first local read buffer and a second local read buffer, the first local read buffer being configured to control the state of a first global bit line in dependence upon the state of the first of the pair of local bit lines during the first memory access and to control the state of the second global bit line in dependence upon the state of the first of the pair of local bit lines during the second memory access, and the second local read buffer being configured to control the state of a third global bit line in dependence upon the state of the second of the pair of local bit lines (during the first memory access and to control the state of the fourth global bit line in dependence upon the state of the second of the pair of local bit lines during the second memory access.

The first local read buffer and the second local read buffer may each comprise a dynamic buffer that is enabled during the respective memory access, and wherein the dynamic buffer is configured to pulldown on the respective global bit line in dependence upon the state of the respective local bit line when the dynamic buffer is enabled.

The third local read buffer and the fourth local read buffer may each comprise a dynamic buffer that is enabled during the respective memory access, and wherein the dynamic buffer is configured to pulldown on the respective global bit line in dependence upon the state of the respective local bit line when the dynamic buffer is enabled.

Each memory cell within a memory cell group may be operatively connected to a single local read bit line. The local-to-global interface circuit may then be configured to control the state of a first global bit line in dependence upon the state of the local read bit line during the first memory access, and to control the state of a second global bit line in dependence upon the state of the local read bit line during the second memory access.

The local-to-global interface circuit may comprise a local read buffer, the local read buffer being configured to control the state of the first global bit line in dependence upon the state of the local read bit line during the first memory access and to control the state of the second global bit line in dependence upon the state of the local read bit line during the second memory access. The local read buffer may comprise a dynamic buffer that is enabled during the respective memory access, and wherein the dynamic buffer is configured to pulldown on the respective global bit line in dependence upon the state of the local read bit line when the dynamic buffer is enabled.

The local-to-global interface circuit may comprise a first local read buffer and a second local read buffer, the first local read buffer being configured to control the state of a first global bit line in dependence upon the state of the local read bit line during the first memory access, and the second local read buffer is configured to control the state of the second global bit line in dependence upon the state of the local read bit line during the second memory access. The first local read buffer and the second local read buffer may each comprise a dynamic buffer that is enabled during the respective memory access, and wherein the dynamic buffer is configured to pulldown on the respective global bit line in dependence upon the state of the local read bit line when the dynamic buffer is enabled.

The or each dynamic buffer may comprise a local bit line-enabled pull-up transistor, a clocked transistor connected between the local bit line-dependent pull-up transistor and a buffer node of the dynamic buffer, a precharge pull-down transistor connected between the buffer node and ground, and a buffer pull-down transistor connected to the respective global bit line, a gate of the buffer pull-down transistor being connected to the buffer node.

The precharge pull-down transistor may be configured to discharge the buffer node prior to the respective memory access and the clocked transistor is configured to be enabled during the respective memory access.

The or each dynamic buffer may comprise a local bit line-enabled pull-up transistor, a first clocked transistor connected between the local bit line-dependent pull-up transistor and a first buffer node of the dynamic buffer, a second clocked transistor connected between the local bit line-dependent pull-up transistor and a second buffer node of the dynamic buffer, a first precharge pull-down transistor connected between the first buffer node and ground, a second precharge pull-down transistor connected between the second buffer node and ground, a first buffer pull-down transistor connected to a first global bit line, a gate of the first buffer pull-down transistor being connected to the first buffer node, and a second buffer pull-down transistor connected to a second global bit line, a gate of the second buffer pull-down transistor being connected to the second buffer node.

The first precharge pull-down transistor may be configured to discharge the first buffer node prior to the first memory access, the second precharge pull-down transistor may be configured to discharge the second buffer node prior to the second memory access, the first clocked transistor may be configured to be enabled during the first memory access and the second clocked transistor may be configured to be enabled during the second memory access.

The memory may comprise a first memory cell group comprising a first plurality of memory cells that are each operatively connected to at least one first group local bit line, a second memory cell group comprising a second plurality of memory cells that are each operatively connected to at least one second group local bit line, the at least one first group local bit line and the at least one second group local bit line both being connected to a local-to-global interface circuit. The local-to-global interface circuit may then be configured to control the state of at least one first global bit line in dependence upon the state of either the at least one first group local bit line or the at least one second group local bit line during the first memory access and to control the state of at least one second global bit line in dependence upon the state of either the at least one first group local bit line or the at least one second group local bit line during the second memory access.

The local-to-global interface circuit may comprise a first local read buffer and a second local read buffer, the first local read buffer being configured to control the state of a first global bit line in dependence upon the state of a first group local bit line or a second group local bit line during the first memory access, and the second local read buffer being configured to control the state of the second global bit line in dependence upon the state of either a first group local bit line or a second group local bit line during the second memory access.

The first local read buffer and the second local read buffer may each comprise a dynamic buffer that is enabled during the respective memory access, and wherein the dynamic buffer is configured to pulldown on the respective global bit line in dependence upon the state of either first group local bit line or the second group local bit line when the dynamic buffer is enabled.

Each dynamic buffer may comprise a first group local bit line-enabled pull-up transistor and a second group local bit line-enabled pull-up transistor connected in parallel, a clocked transistor connected between the first and second group local bit line-dependent pull-up transistors and a buffer node of the dynamic buffer, a precharge pull-down transistor connected between the buffer node and ground, and a buffer pull-down transistor connected to the respective global bit line, a gate of the buffer pull-down transistor being connected to the buffer node.

The precharge pull-down transistor may be configured to discharge the buffer node prior to the respective memory access and the clocked transistor is configured to be enabled during the respective memory access.

BRIEF DESCRIPTION OF THE DRAWINGS

The present invention will now be more particularly described by way of example only with reference to the accompanying drawings, in which.

DETAILED DESCRIPTION

As described above, the present inventors have recognised that it is desirable to provide a multiple data rate memory having a hierarchical bit line arrangement that has a very short cycle time in order to be able to achieve multiple data rate read operations. Consequently, there will now be described a multiple data rate memory that includes local-to-global interface circuits that can demultiplex data read from the memory cells within the memory at a multiple data rate onto separate global bit lines, and FIGS. 5 to 10 illustrate schematically examples of part of a multiple data rate memory comprising such a local-to-global interface circuit.

In each of FIGS. 5 to 10, the multiple data rate memory is configured to implement first and second memory accesses within a single cycle of an external clock signal. The multiple data rate memory comprises a plurality of memory cell groups, each memory cell group comprising a plurality of memory cells 10 that are each operatively connected to at least one local bit line 20. The at least one local bit line 20 of each memory cell group is connected to a local-to-global interface circuit 30. The local-to-global interface circuit 30 is configured to control the state of at least one first global bit line 40 in dependence upon the state of the at least one local bit line 20 during the first memory access and to control the state of at least one second global bit line 50 in dependence upon the state of the at least one local bit line 20 during the second memory access.

Each of the plurality of memory cells within a memory cell group is associated with a wordline 60 that controls the connection of the memory cell to the at least one local bit line. The associated wordline 60 is then connected to a wordline driver that provides a multiple data rate wordline signal that can therefore implement multiple memory accesses within a single cycle of the external clock signal. The multiple data rate memory will also comprise a pre-charge circuit (not shown) that is configured to provide a voltage for charging the one or more local bit lines at the multiple data rate.

Figure 1:
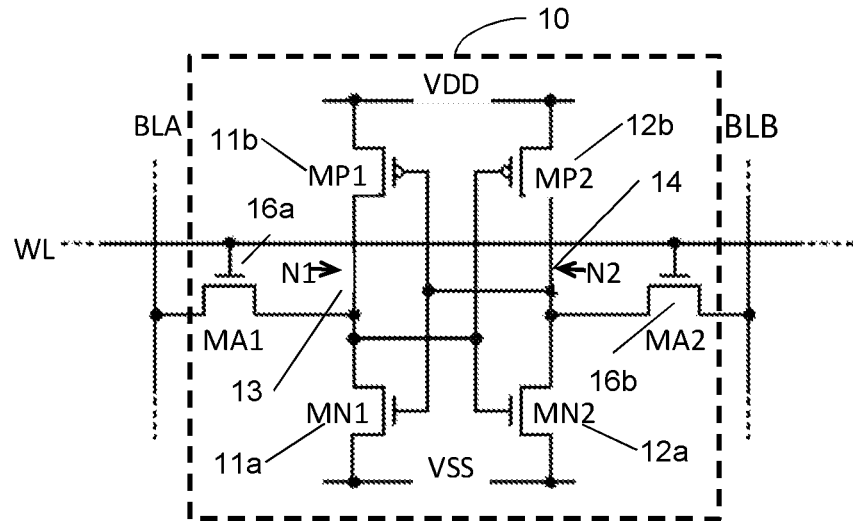
FIG. 1 illustrates a standard 6-transistor memory cell.
Figure 2:
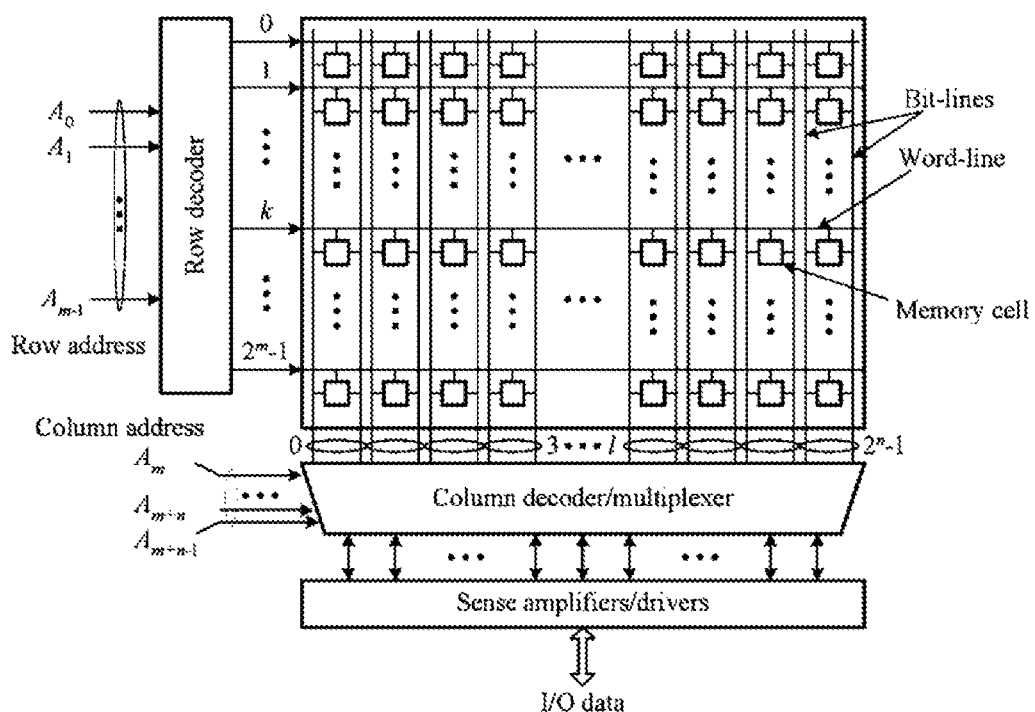
FIG. 2 illustrates an example of a conventional array of memory cells.
Figure 3:
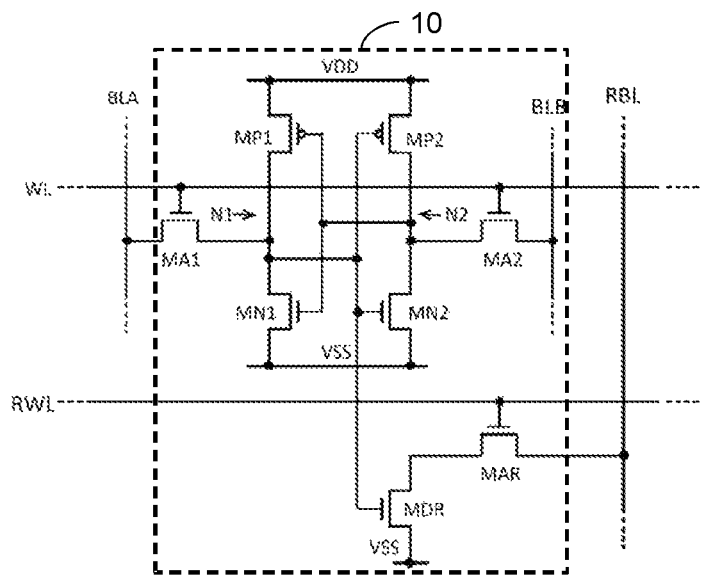
FIG. 3 illustrates schematically an example of an 8-transistor memory cell having a single-ended read port.
Figure 4:
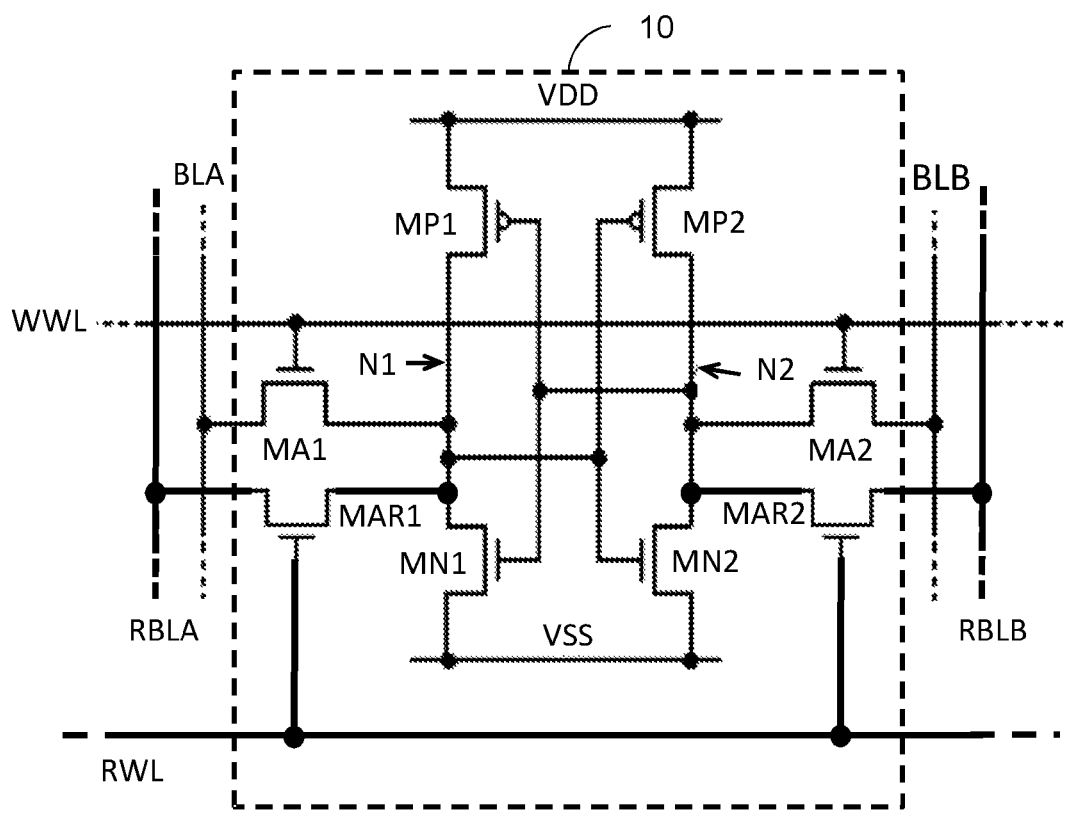
FIG. 4 illustrates schematically an example of an alternative 8-transistor memory cell having a differential/double-ended read port.
Figure 5:
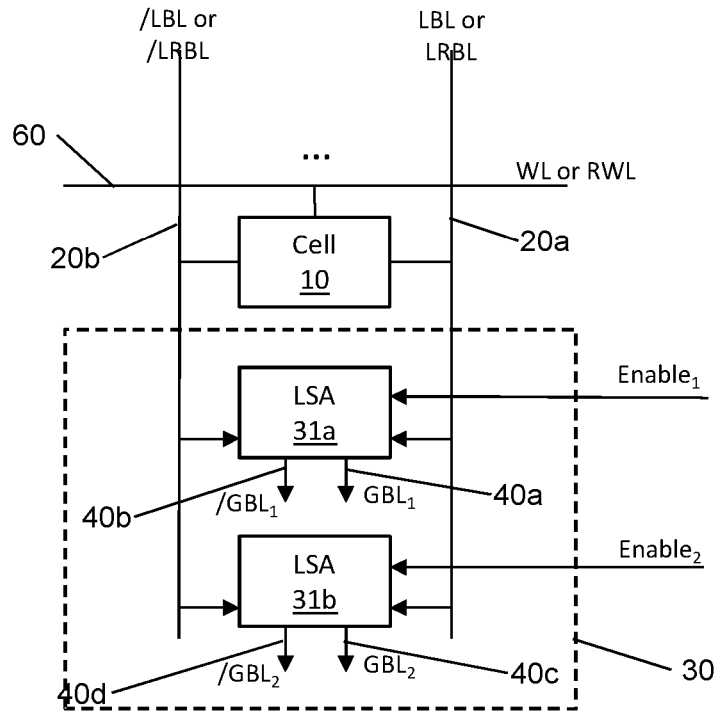
FIG. 5 illustrates schematically a first example of a multiple data rate memory comprising a local-to-global interface circuit as described herein.
Figure 6:
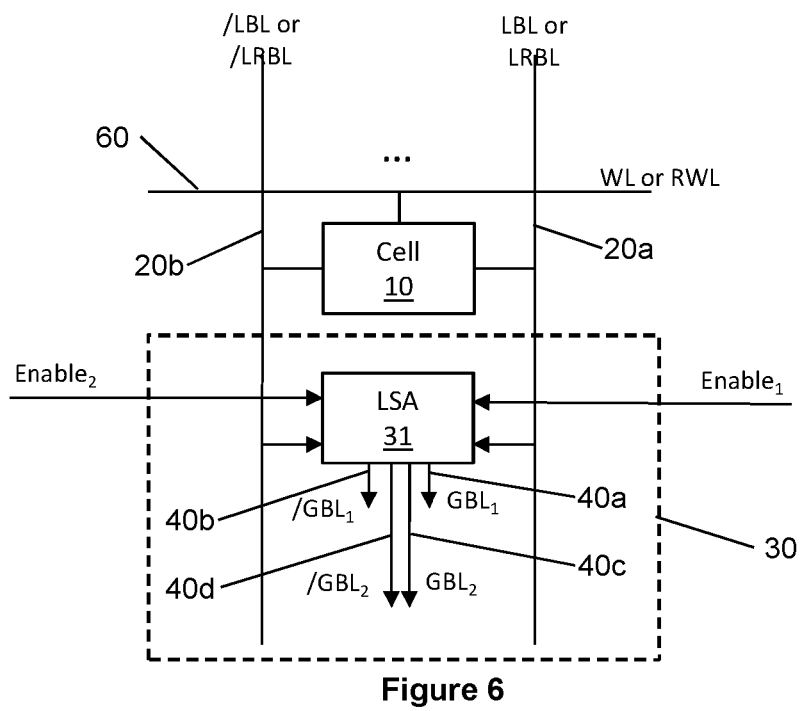
FIG. 6 illustrates schematically a second example of a multiple data rate memory comprising a local-to-global interface circuit as described herein.

In the examples of FIGS. 5 and 6, each of the plurality of memory cells 10 within a memory cell group is operatively connected to a pair of complementary local bit lines 20a, 20b. These can either be a pair of local bit lines (LBL, /LBL) that are used for both read and write operations or can be a pair of local read bit lines that are used exclusively for read operations (LRBL, /LRBL). The local-to-global interface circuit is then configured to control the state of a pair of complementary first global bit lines (GBL1, /GBL1) 40a, 40b in dependence upon the state of the pair of local bit lines 20a, 20b during the first memory access, and to control the state of a pair of complementary second global bit lines (GBL2, /GBL2) 40c, 40d in dependence upon the state of the pair of local bit lines 20a, 20b during the second memory access.

In the example of FIG. 5, the local-to-global interface circuit 30 comprises a first local sense amplifier (LSA) 31a and a second local sense amplifier (LSA) 31b. The first local sense amplifier 31a is configured to control the state of the pair of complementary first global bit lines (GBL1, /GBL1) 40a, 40b in dependence upon the state of the pair of local bit lines 20a, 20b during the first memory access. The second local sense amplifier 31b is then configured to control the state of the pair of complementary second global bit lines (GBL2, /GBL2) 40c, 40d in dependence upon the state of the pair of local bit lines 20a, 20b during the second memory access.

Figure 11:
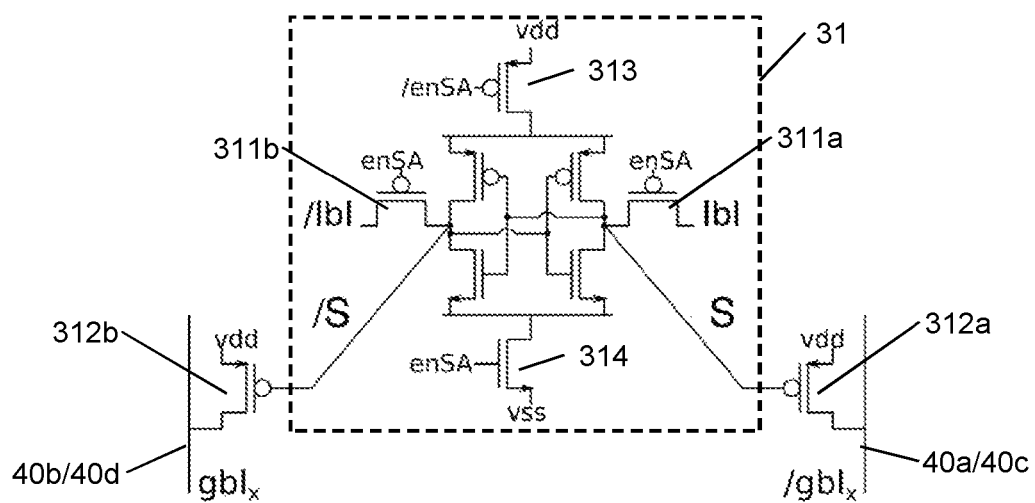
FIG. 11 illustrates schematically an example of a local sense amplifier for use in the local-to-global interface circuit as described herein.

FIG. 11 illustrates schematically an example of such a local sense amplifier (LSA) 31 for use in the local-to-global interface circuit 30 described herein. In the example of FIG. 11, the local sense amplifier 31 comprises a latch-type sense amplifier with pass transistors 311a, 311b that is enabled during a memory access.

The latch-type sense amplifier comprises a pair of cross-coupled inverters having respective first and second sense nodes (S, /S), the first sense node being connected to a gate of a first pullup transistor 312a that is connected to a first of the pair of complementary global bit lines 40a or 40c (/gbl$_x$), and the second sense node being connected to a gate of second pullup transistor 312b that is connected to a second of the pair of complementary global bit lines 40b or 40d (gbl$_x$). The first and second pullup transistors 312a, 312b therefore act as respective first and second global bit line switches that connect the respective global bit lines to a positive voltage supply in dependence upon the state of the respective sense node.

The pass transistors 311a, 311b control the connection of the latch-type sense amplifier to the pair of complementary local bit lines 20a, 20b and are configured to connect the latch-type sense amplifier to the local bit lines when the latch-type sense amplifier is disabled and to disconnect the latch-type sense amplifier from the local bit lines when the latch-type sense amplifier is enabled.

Specifically, a first of the pass transistors 311a is operatively connected to the first sense node (S), with the gate of the first pass transistor 311a being connected to a sense amplifier enable signal (enSA) that turns off the first pass transistor 311a when the latch-type sense amplifier is enabled. The second of the pass transistors 311b is then operatively connected to the second sense node (/S), with the gate on the second pass transistor 311b also being connected to the sense amplifier enable signal (enSA) that turns off the second pass transistor 311b when the latch-type sense amplifier is enabled. In this example, the first and second pass transistors 311a, 311 b are both provided by PMOS transistors that are therefore turned off when the sense amplifier enable signal (enSA) goes high.

The latch-type sense amplifier also comprises a positive supply transistor 313 and a negative supply/ground transistor 314. The positive supply transistor 313 is configured to connect the latch-type sense amplifier to a positive voltage supply (VDD) when the latch-type sense amplifier is enabled. The negative supply/ground transistor 314 is then also configured to connect the latch-type sense amplifier to ground (VSS) when the latch-type sense amplifier is enabled.

In this specific example, the positive supply transistor 313 is provided by a PMOS transistor whose gate is connected to an inverted sense amplifier enable signal (/enSA). Consequently, when the sense amplifier enable signal (enSA) goes high, the inverted signal goes low (/enSA), turning on the PMOS transistor and connecting the positive voltage supply (VDD). The negative supply/ground transistor 314 is provided by an NMOS transistor whose gate is connected to the sense amplifier enable signal (enSA). Consequently, when the sense amplifier enable signal (enSA) goes high, the NMOS transistor is turned on thereby connecting the latch-type sense amplifier to ground (VSS).

When used in the exemplary local-to-global interface circuit 30 illustrated in FIG. 5, both the first local sense amplifier (LSA) 31a and the second local sense amplifier (LSA) 31b would comprise such a latch-type sense amplifier. The sense amplifier enable signal (enSA) provided to the first local sense amplifier (LSA) 31a would then comprise a first enable signal (Enable$_1$) generated during the first memory access, and the sense amplifier enable signal (enSA) provided to the second local sense amplifier (LSA) 31b would then comprise a second enable signal (Enable$_2$) generated during the second memory access. The first enable signal (Enable$_1$) is therefore configured to enable the first local sense amplifier (LSA) 31a during the first memory access, and the second enable signal (Enable$_2$) is configured to enable the second local sense amplifier (LSA) 31b during the second memory access.

In the example of FIG. 6, the local-to-global interface circuit 30 comprises a single local sense amplifier 31. This local sense amplifier 31 is configured to control the state of the pair of first global bit lines (GBL1, /GBL1) 40a, 40b in dependence upon the state of the pair of local bit lines 20a, 20b during the first memory access and to control the state of the pair of second global bit lines (GBL2, /GBL2) 40c, 40d in dependence upon the state of the pair of local bit lines 20a, 20b during the second memory access. In this example, as there is only a single local sense amplifier 31, the demultiplexing would have to take place within the local sense amplifier 31 itself. This would be possible by adapting the latch-type sense amplifier illustrated in FIG. 11. In this example, the first enable signal (Enable$_1$) would therefore configured to enable the local sense amplifier (LSA) 31 during the first memory access, whilst the second enable signal (Enable$_2$) would be configured to enable the local sense amplifier (LSA) 31b-during the second memory access.

Figure 7:
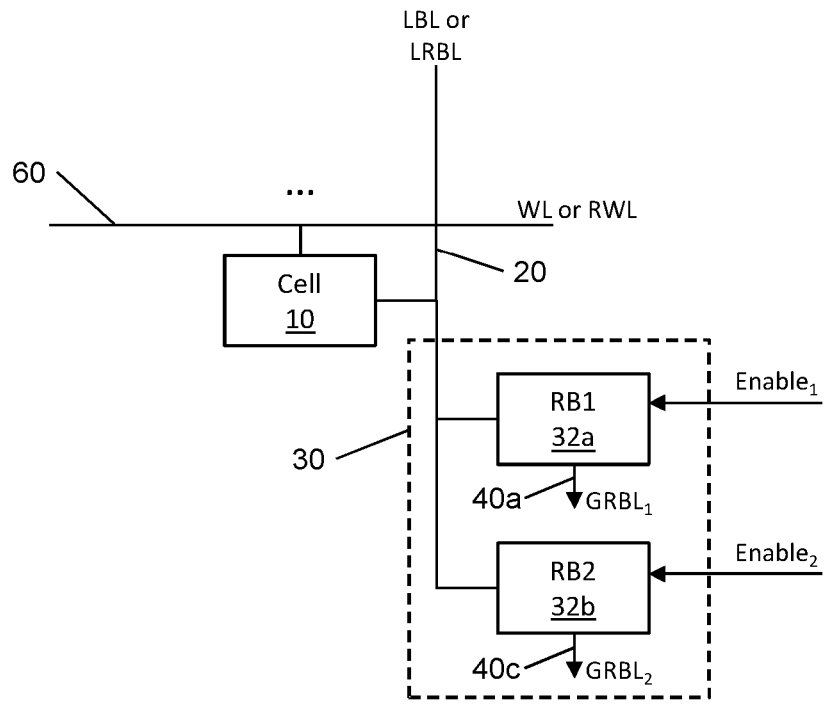
FIG. 7 illustrates schematically a third example of a multiple data rate memory comprising a local-to-global interface circuit as described herein.
Figure 8:
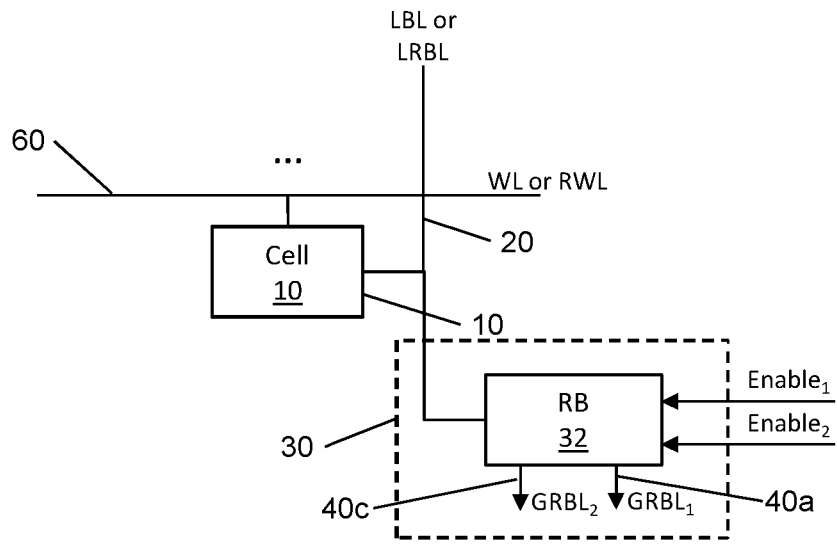
FIG. 8 illustrates schematically a fourth example of a multiple data rate memory comprising a local-to-global interface circuit as described herein.

In the examples of FIGS. 7 and 8, each memory cell within a memory cell group is operatively connected to a single local read bit line 20. The local-to-global interface circuit is then configured to control the state of a first global read bit line (GRBL1) 40a in dependence upon the state of the local read bit line (LRBL) 20 during the first memory access, and to control the state of a second global read bit line (GRBL2) 40c in dependence upon the state of the local read bit line (LRBL) 20 during the second memory access.

In the example of FIG. 7, the local-to-global interface circuit 30 comprises a first local read buffer 32a and a second local read buffer 32b. The first local read buffer 32a is configured to control the state of the first global read bit line (GRBL1) 40a in dependence upon the state of the local read bit line (LRBL) 20 during the first memory access. The second local read buffer 32b is then configured to control the state of the second global bit line (GRBL2) 40c in dependence upon the state of the local read bit line (LRBL) 20 during the second memory access. In this example, the first enable signal (Enable1) is therefore configured to enable the first local read buffer 32a during the first memory access, and the second enable signal (Enable2) is configured to enable the second local read buffer 32b during the second memory access.

Figure 12:
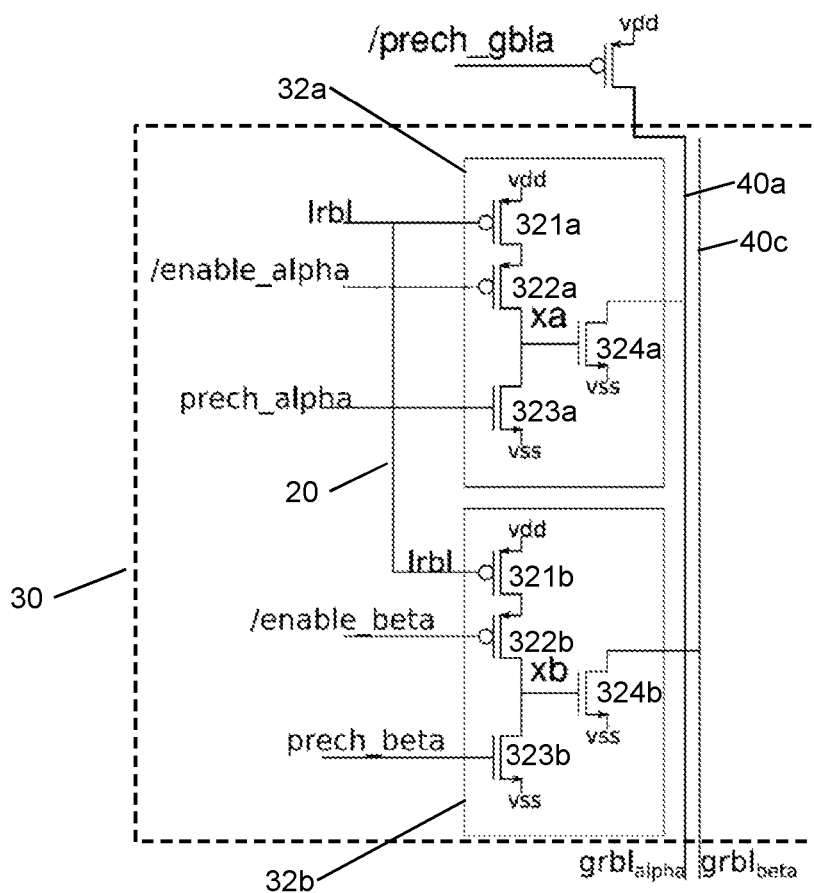
FIG. 12 illustrates schematically a first example of a local-to-global interface circuit comprising read buffers as described herein.

FIG. 12 illustrates schematically an example such a local-to-global interface circuit 30 that comprises a first local read buffer 32a and a second local read buffer 32b. In this example, both the first local read buffer 32a and the second local read buffer 32b each comprise a dynamic buffer that is enabled during the respective memory access. The dynamic buffer is configured to pulldown on the respective global bit line in dependence upon the state of the local read bit line (LRBL) when the dynamic buffer is enabled.

Specifically, each dynamic buffer comprises a local bit line-enabled pull-up transistor 321a, 321b and a clocked transistor 322a, 322b connected between the local bit line-dependent pull-up transistor 321a, 321b and a buffer node (xa/xb) of the dynamic buffer. Each dynamic buffer further comprises a precharge pull-down transistor 323a, 323b connected between the buffer node and ground. A buffer pull-down transistor 234a, 324b is then connected to the respective global bit line (grbl$_{alpha}$, grbl$_{beta}$), with a gate of the buffer pull-down transistor 234a, 324b being connected to the buffer node. The precharge pull-down transistor 323a, 323b is configured to discharge the buffer node (xa/xb) prior to the respective memory access and the clocked transistor 322a, 322b is configured to be enabled during the respective memory access.

In this specific example, in order to implement a read operation during either the first memory access (alpha phase) or the second memory access (beta phase) the PMOS clocked transistor 322a, 322b within the corresponding dynamic buffer is turned on by an inverted enable signal (/enable_alpha or /enable_beta) going low. This connects the local bit line-enabled pull-up transistor 321a, 321b to the buffer node (xa/xb).

When used in the exemplary local-to-global interface circuit 30 illustrated in FIG. 7, the inverted enable signals (/enable_alpha or /enable_beta) provided to the first local read buffer 32a and the second local read buffer 32b respectively would then comprise an inverted first enable signal (Enable$_1$) generated during the first memory access and an inverted second enable signal (Enable$_2$) generated during the second memory access. The first enable signal (Enable$_1$) is therefore configured to enable the first local read buffer 32a during the first memory access, and the second enable signal (Enable$_2$) is configured to enable the second local read buffer 32b during the second memory access.

If the state of the local bit line 20 is high, then the PMOS local bit line-enabled pull-up transistor 321a, 321b will stay off. The buffer node (xa/xb), having been precharged low, will therefore stay low and the NMOS buffer pull-down transistor 324a, 324b will also stay low. The global line 40a, 40c, having been precharged high, will therefore stay high, reflecting the high value of the local bit line.

If the local bit line 20 is low then the PMOS local bit line-enabled pull-up transistor 321a, 321b will be turned on, connecting the buffer node (xa/xb) to the positive voltage supply (VDD) so that the NMOS buffer pull-down transistor 324a, 324b is turned on. Turning on the NMOS buffer pull-down transistor 324a, 324b connects the corresponding global bit line 40a, 40c to ground (VSS) so that the global bit line also goes low, reflecting the low value of the local bit line 20. The inverted enable signal (/enable_alpha or /enable_beta) then goes high, disconnecting the local bit line-enabled pull-up transistor 321a, 321b from the buffer node (xa/xb). The precharge pull-down transistor 323a, 323b is then turned on by a precharge control signal (prech_alpha or prech_beta) so that the buffer node (xa/xb) is connected to ground (VSS) and pulled low again in preparation for the next read operation.

In the example of FIG. 8, the local-to-global interface circuit 30 comprises a single local read buffer 32. The local read buffer 32 is configured to control the state of the first global bit line (GBL1) 40a in dependence upon the state of the local read bit line (LRBL) 20 during the first memory access and to control the state of the second global bit line (GBL2) 40c in dependence upon the state of the local read bit line (LRBL) 20 during the second memory access.

Figure 13:
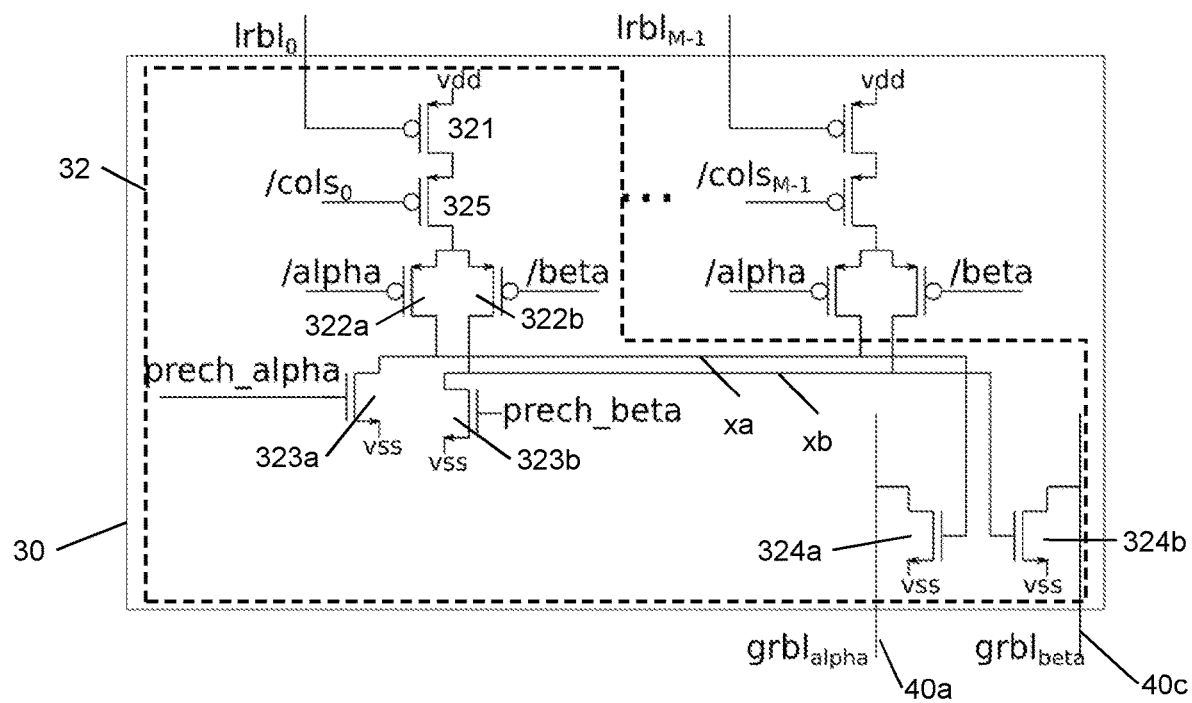
FIG. 13 illustrates schematically a second example of a local-to-global interface circuit comprising read buffers as described herein.

FIG. 13 illustrates schematically an example such a local-to-global interface circuit 30 that comprises a single local read buffer 32. In this example, the local read buffer 32 comprises a dynamic buffer that is enabled during each of first and second memory accesses, and wherein the dynamic buffer is configured to pulldown on the respective global bit line in dependence upon the state of the local read bit line (LRBL) when the dynamic buffer is enabled.

Specifically, the dynamic buffer comprises a local bit line-enabled pull-up transistor 321, a first clocked transistor 322a connected between the local bit line-dependent pull-up transistor 321 and a first buffer node (xa) of the dynamic buffer, and a second clocked transistor 322b connected between the local bit line-dependent pull-up transistor 321 and a second buffer node (xb) of the dynamic buffer. A first precharge pull-down transistor 323a is then connected between the first buffer node (xa) and ground, whilst a second precharge pull-down transistor 323b connected between the second buffer node (xb) and ground. A first buffer pull-down transistor 324a is then connected to a first global bit line (grbl$_{alpha}$) 40a, with a gate of the first buffer pull-down transistor 324a being connected to the first buffer node (xa), and a second buffer pull-down transistor 323b connected to a second global bit line 40c (grbl$_{beta}$), with a gate of the second buffer pull-down transistor 324b being connected to the second buffer node (xb).

The first precharge pull-down transistor 323a is configured to discharge the first buffer node (xa) prior to the first memory access, and the second precharge pull-down transistor 323b is configured to discharge the second buffer node (xb) prior to the second memory access. The first clocked transistor 322a is configured to be enabled during the first memory access (alpha phase) and the second clocked transistor 322b is configured to be enabled during the second memory access (beta phase)

In this example, the first precharge pull-down transistor 323a and the second precharge pull-down transistor 323b, and the first buffer pull-down transistor 324a and the second buffer pull-down transistor 324b, are shared between a plurality of read buffers from different columns that then multiplex the outputs of the read buffers onto the global bit lines. Each dynamic buffer therefore further comprises a column-enabled transistor 325 between the local bit line-enabled pull-up transistor 321 and the first and second clocked transistors 322a, 322b. This column-enabled transistor 325 is configured to conduct when the corresponding column has been selected by a column enable signal. In this example, column-enabled transistor 325 comprises a PMOS transistor whose gate is connected to an inverted column select signal (/cols). Consequently, when the column has been selected the inverted column select signal will go low, turning on the PMOS column-enabled transistor 325. Alternatively, this sharing of transistors between a plurality of read buffers from different columns could be achieved without the separate column-enabled transistor by combining the inverted column select signal and the inverted enable signal, and using this combined signal to activate the appropriate clocked transistor.

Figure 10:
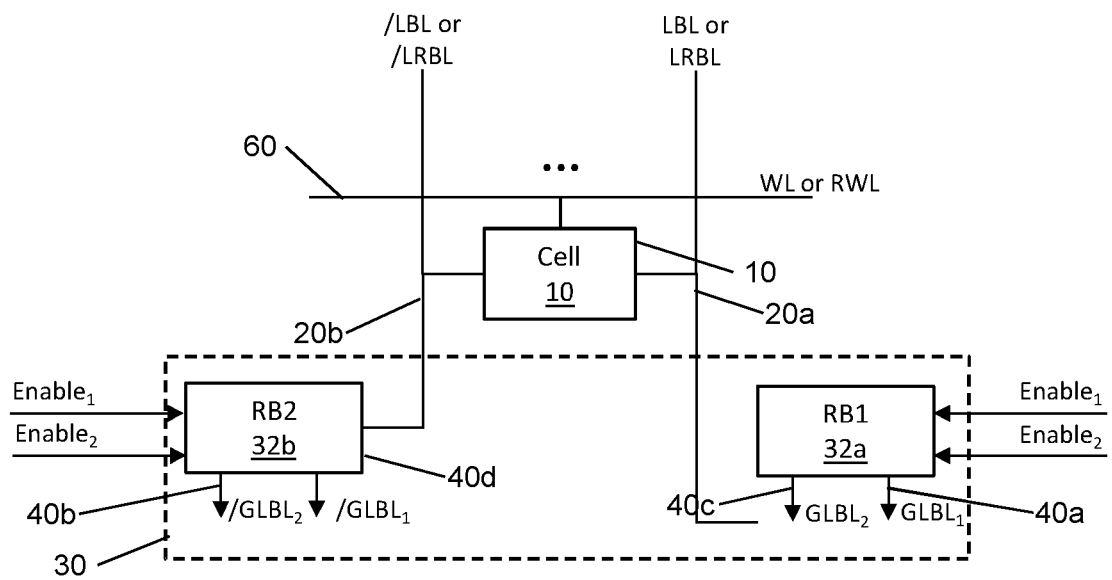
FIG. 10 illustrates schematically a sixth example of a multiple data rate memory comprising a local-to-global interface circuit as described herein.

In this example, a read operation is implemented in essentially the same way as for the example of FIG. 10; however, in this circuit the single read buffer 32 implements the demultiplexing of the local bit line data onto the separate global bit lines. Essentially, this single read buffer 32 combines both of the dynamic buffers of FIG. 10 into a single circuit where the dynamic buffers share the same local bit line-dependent pull-up transistor 321.

When used in the exemplary local-to-global interface circuit 30 illustrated in FIG. 8, the inverted enable signals (/alpha or /beta) provided to the local read buffer 32 would then comprise an inverted first enable signal (Enable₁) generated during the first memory access and an inverted second enable signal (Enable₂) generated during the second memory access. The first enable signal (Enable₁) is therefore configured to enable the local read buffer 32 during the first memory access, whilst the second enable signal (Enable₂) is configured to enable the local read buffer 32 during the second memory access.

Figure 15:
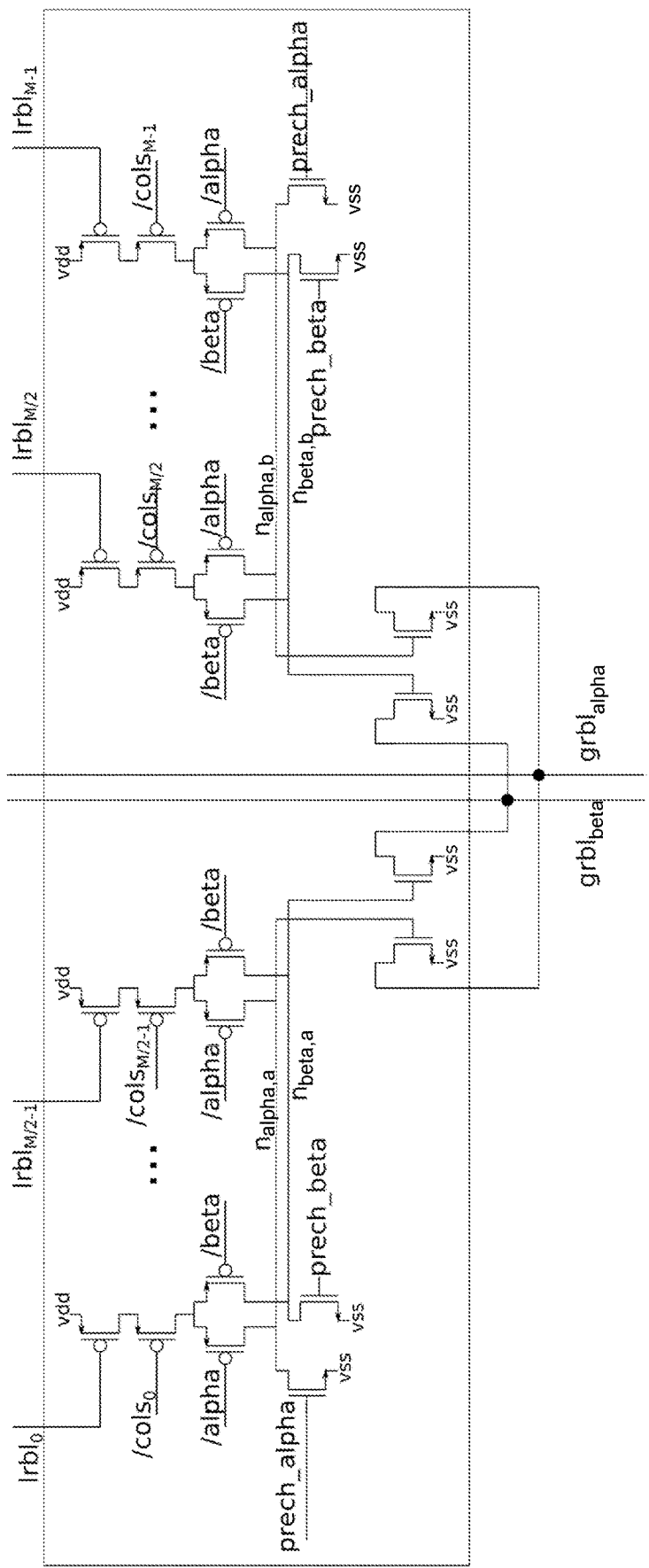
FIG. 15 illustrates schematically a fourth example of a local-to-global interface circuit comprising read buffers as described herein.

FIG. 15 illustrates an example in which a plurality of read buffers from different columns multiplex their outputs onto the global bit lines; however, for large numbers of columns it may be preferable to perform this multiplexing in stages. FIG. 15 therefore illustrates an example of a multiple data rate memory in which two groups of multiple local-to-global interface circuits separately multiplex their outputs onto the global bit lines.

Figure 9:
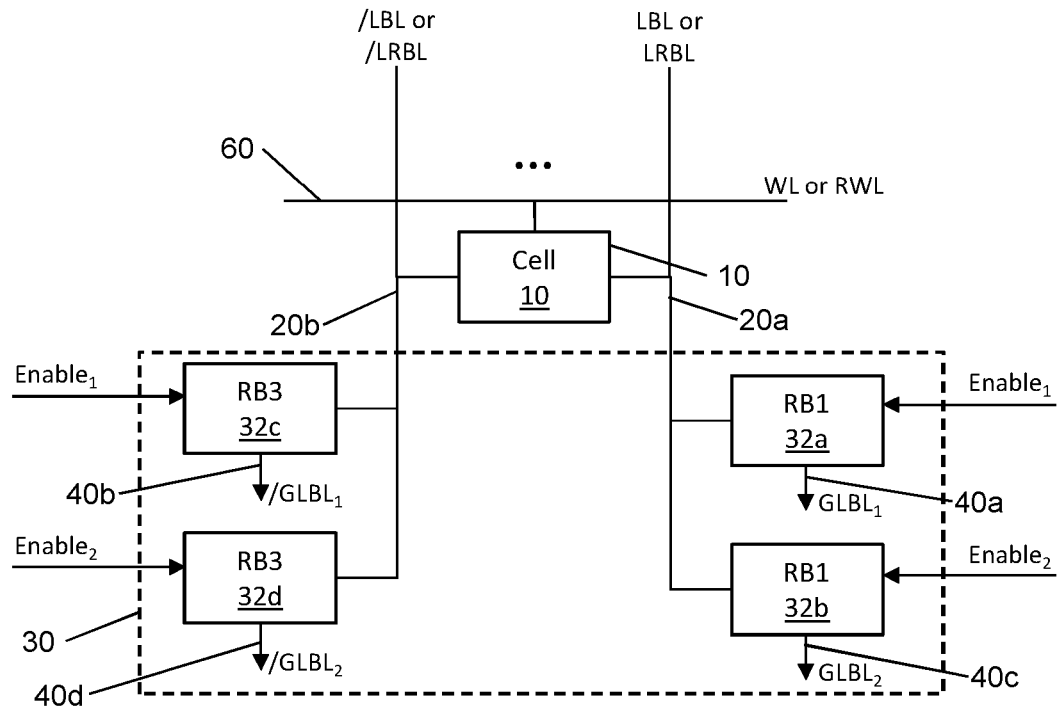
FIG. 9 illustrates schematically a fifth example of a multiple data rate memory comprising a local-to-global interface circuit as described herein.

In the examples of FIGS. 9 and 10, each of the plurality of memory cells within a memory cell group is operatively connected to a pair of complementary local bit lines 20a, 20b. These can either be a pair of local bit lines (LBL, /LBL) that are used for both read and write operations or can be a pair of local read bit lines that are used exclusively for read operations (LRBL, /LRBL). The local-to-global interface circuit 30 is then configured to control the state of a first global bit line (GBL1) 40a in dependence upon the state of a first of the pair of local bit lines (LBL or LRBL) 20a during the first memory access, and to control the state of a second global bit line (GBL2) 40c in dependence upon the state of the first of the pair of local bit lines (LBL or LRBL) 20a during the second memory access.

The local-to-global interface circuit 30 is further configured to control the state of a third global bit line (/GBL1) 40b in dependence upon the state of a second of the pair of local bit lines (/LBL or /LRBL) 20b during the first memory access, and to control the state of a fourth global bit line (/GBL2) 40d in dependence upon the state of the second of the pair of local bit lines (/LBL or /LRBL) 20b during the second memory access.

Specifically, first global bit line 40a is the first of a pair of complementary first global bit lines 40a, 40b, the second global bit line (GBL2) 40c is the first of a pair of complementary second global bit lines 40c, 40d, third global bit line (/GBL1) 40b is the second of the pair of complementary first global bit lines 40a, 40b, and fourth global bit line (/GBL2) 40d is the second of the pair of complementary second global bit lines 40c, 40d.

In the example of FIG. 9, the local-to-global interface circuit 30 comprises a first local read buffer 32a and a second local read buffer 32b. The first local read buffer 32a is configured to control the state of the first global bit line (GBL1) 40a in dependence upon the state of the first of the pair of local bit lines (LBL or LRBL) 20a during the first memory access, and the second local read buffer 32b is configured to control the state of the second global bit line (GBL2) 40c in dependence upon the state of the first of the pair of local bit lines (LBL or LRBL) 20a during the second memory access.

The local-to-global interface circuit 30 then further comprises a third local read buffer 32c and fourth local read buffer 32d. The third local read buffer 32c is configured to control the state of a third global bit line (/GBL1) 40b in dependence upon the state of a second of the pair of local bit lines (/LBL or /LRBL) 20b during the first memory access, and the fourth local read buffer 32d is configured to control the state of a fourth global bit line (/GBL2) 40d in dependence upon the state of the second of the pair of local bit lines (/LBL or /LRBL) 20b during the second memory access.

In the example of FIG. 9, each of the first local read buffer 32a, the second local read buffer 32b, the third local read buffer 32c and the fourth local read buffer 32d can comprise a dynamic buffer that is enabled during the respective memory access. Such a dynamic buffer would be configured to pulldown on the respective global bit line in dependence upon the state of the respective local bit line when the dynamic buffer is enabled. Consequently, the first local read buffer 32a and the second local read buffer 32b could be of the same form as the read buffers shown in FIG. 12. The third local read buffer 32c and fourth local read buffer 32d could then also be of the same form as the read buffers shown in FIG. 12

In the example of FIG. 10, the local-to-global interface circuit 30 comprises a first local read buffer 32a and a second local read buffer 32b. The first local read buffer 32a is configured to control the state of the first global bit line (GBL1) 40a in dependence upon the state of the first of the pair of local bit lines (LBL or LRBL) 20a during the first memory access and to control the state of the second global bit line (GBL2) 40c in dependence upon the state of the first of the pair of local bit lines (LBL or LRBL) 20a during the second memory access. The second local read buffer 32b is then configured to control the state of a third global bit line (/GBL1) 40b in dependence upon the state of the second of the pair of local bit lines (/LBL or /LRBL) 20b during the first memory access and to control the state of the fourth global bit line (/GBL2) 40d in dependence upon the state of the second of the pair of local bit lines (/LBL or /LRBL) 20b during the second memory access.

In the example of FIG. 10, each of the first local read buffer 32a and the second local read buffer 32b can comprise a dynamic buffer that is enabled during each of first and second memory accesses, and wherein the dynamic buffer is configured to pulldown on the respective global bit line in dependence upon the state of the local read bit line (LRBL) when the dynamic buffer is enabled. Consequently, each of the first local read buffer 32a and the second local read buffer 32b could take the same form as the read buffer shown in FIG. 13.

As described above, FIG. 12 illustrates an example of a local-to-global interface circuit 30 that comprises a first local read buffer 32a and a second local read buffer 32b. FIG. 13 then illustrates an example of a local-to-global interface circuit 30 that effectively combines the first local read buffer 32a and a second local read buffer 32b into a single read buffer to reduce the number of transistors.

Figure 14:
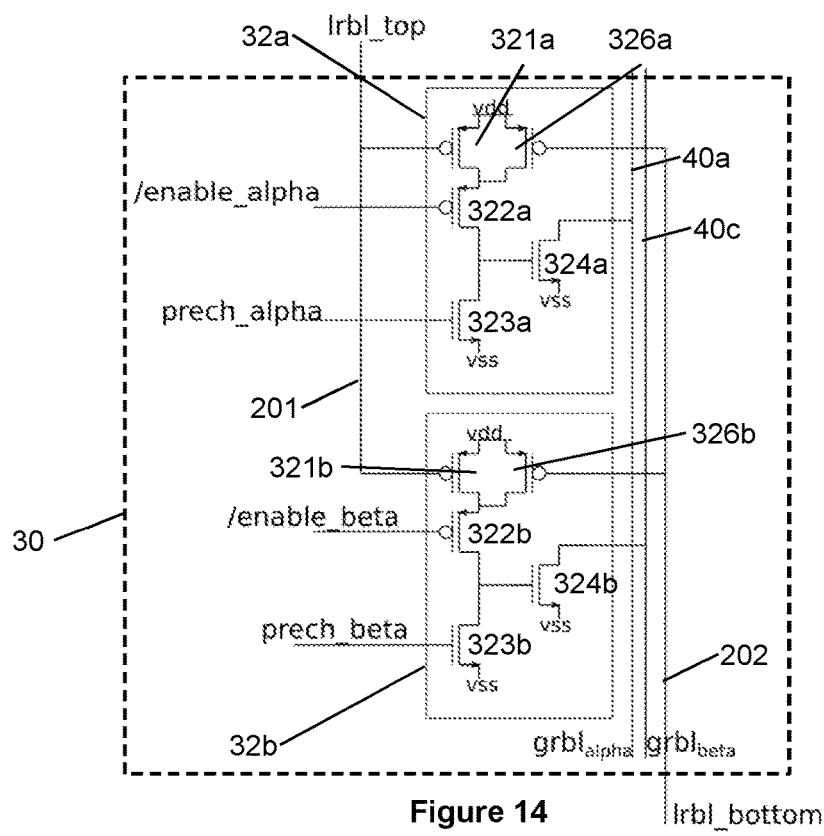
FIG. 14 illustrates schematically a third example of a local-to-global interface circuit comprising read buffers as described herein.

FIG. 14 illustrates a further example of a local-to-global interface circuit 30 that comprises a first local read buffer 32a and a second local read buffer 32b; however, in this example, the first local read buffer 32a and the second local read buffer 32b are both shared by two local bit lines that are from different groups of memory cells. In particular, both the first local read buffer 32a and the second local read buffer 32b serve a local bit line 201 from a block located above the local-to-global interface circuit 30 and a further local bit line 202 from a block located below the local-to-global interface circuit 30.

In the example of FIG. 14, the multiple data rate memory comprises a first memory cell group comprising a first plurality of memory cells that are each operatively connected to at least one first group local bit line (lrbl_top) 201, and a second memory cell group comprising a second plurality of memory cells that are each operatively connected to at least one second group local bit line (lrbl_bottom) 202. The at least one first group local bit line 201 and the at least one second group local bit line 202 are both connected to the same local-to-global interface circuit 30. This local-to-global interface circuit 30 is therefore configured to control the state of at least one first global bit line 40a ($grbl_{alpha}$) in dependence upon the state of either the at least one first group local bit line 201 or the at least one second group local bit line 202 during the first memory access, and to control the state of at least one second global bit line 40c ($grbl_{beta}$) in dependence upon the state of either the at least one first group local bit line 201 or the at least one second group local bit line 202 during the second memory access.

In the example of FIG. 14, the local-to-global interface circuit 30 comprises a first local read buffer 32a and a second local read buffer 32b. The first local read buffer 32a is configured to control the state of the first global bit line ($grbl_{alpha}$) 40a in dependence upon the state of either the first group local bit line (lrbl_top) 201 or a second group local bit line (lrbl_bottom) 202 during the first memory access. The second local read buffer 32b is then configured to control the state of the second global bit line ($grbl_{beta}$) in dependence upon the state of either the first group local bit line (lrbl_top) 201 or the second group local bit line (lrbl_bottom) 202 during the second memory access.

Specifically, the first local read buffer 32a and the second local read buffer 32b each comprise a dynamic buffer that is enabled during the respective memory access, wherein the dynamic buffer is configured to pulldown on the respective global bit line in dependence upon the state of either first group local bit line (lrbl_top) 201 or the second group local bit line (lrbl_bottom) 202 when the dynamic buffer is enabled. Both the first local read buffer 32a and the second local read buffer 32b are therefore substantially the same as the read buffers illustrated in FIG. 12, with the exception of the addition of a further, second local bit line-enabled pull-up transistor 326a, 326b that is connected in parallel with the first local bit line-enabled pull-up transistor 321a, 321b. The first local bit line-enabled pull-up transistor 321a, 312b is then controlled by the first group local bit line (lrbl_top) 201, whilst second local bit line-enabled pull-up transistor 326a, 326b is controlled by the second group local bit line (lrbl_bottom) 202.

The inverted enable signals (/enable_alpha or /enable_beta) provided to the first local read buffer 32a and the second local read buffer 32b respectively would then comprise an inverted first enable signal ($Enable_1$) generated during the first memory access and an inverted second enable signal ($Enable_2$) generated during the second memory access. The first enable signal ($Enable_1$) is therefore configured to enable the first local read buffer 32a during the first memory access, and the second enable signal ($Enable_2$) is configured to enable the second local read buffer 32b during the second memory access.

Figure 16:
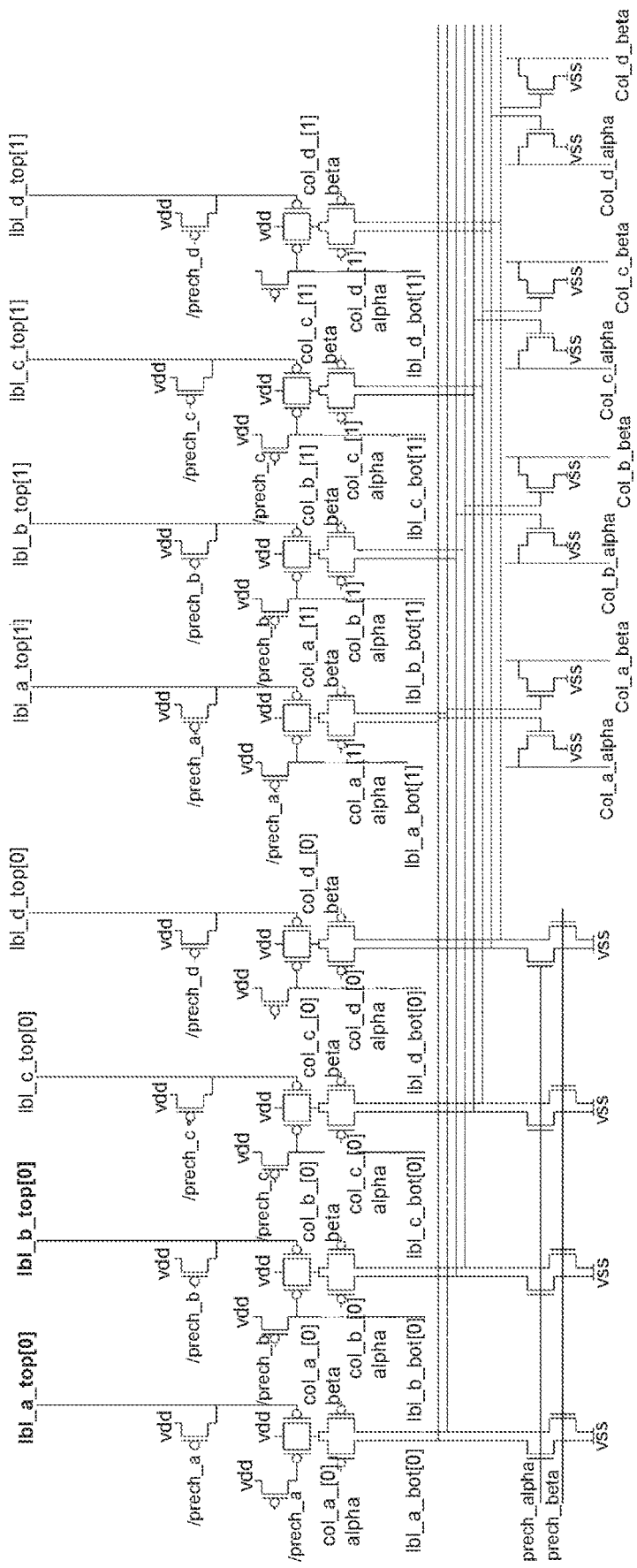
FIG. 16 illustrates schematically a fifth example of a local-to-global interface circuit comprising read buffers as described herein.

FIG. 16 then illustrates an example in which each read buffer in the local-to-global circuits implements the demultiplexing of the local bit line data from the first (alpha) and second (beta) memory accesses onto separate global bit lines, whilst also serving local bit lines from different groups of memory cells and sharing transistors between a plurality of read buffers, i.e. effectively combining the concepts illustrated in FIGS. 13, 14 and 15.

It will be appreciated that individual items described above may be used on their own or in combination with other items shown in the drawings or described in the description and that items mentioned in the same passage as each other or the same drawing as each other need not be used in combination with each other. In addition, any reference to "comprising" or "consisting" is not intended to be limiting in any way whatsoever and the reader should interpret the description and claims accordingly. Furthermore, although the invention has been described in terms of preferred embodiments as set forth above, it should be understood that these embodiments are illustrative only.

Those skilled in the art will be able to make modifications and alternatives in view of the disclosure which are contemplated as falling within the scope of the appended claims. For example, those skilled in the art will appreciate that the above-described invention might be equally applicable to other types of memory.

The invention claimed is:

1. A multiple data rate memory configured to implement first and second memory accesses within a single cycle of an external clock signal, the memory comprising:
   a plurality of memory cell groups, each memory cell group comprising a plurality of memory cells that are each operatively connected to at least one pair of local bit lines;
   the at least one local bit line of each memory cell group being connected to a local-to-global interface circuit;
   wherein the local-to-global interface circuit is configured to control the state of at least one first global bit line in dependence upon the state of the at least one local bit line during the first memory access and to control the state of at least one second global bit line in dependence upon the state of the at least one local bit line during the second memory access;

wherein the local-to-global interface circuit comprises a first local dynamic read buffer and a second local dynamic read buffer, the first local read buffer being configured to control the state of a first global bit line in dependence upon the state of the first of the pair of local bit lines during the first memory access, and the second local read buffer is configured to control the state of the second global bit line in dependence upon the state of the first of the pair of local bit lines during the second memory access;

wherein each dynamic read buffer is configured to pull-down on the respective global bit line in dependence upon the state of the respective local bit line when the dynamic buffer is enabled; and wherein the or each dynamic buffer comprises:

a local bit line-enabled pull-up transistor;

a clocked transistor connected between the local bit line-dependent pull-up transistor and a buffer node of the dynamic buffer;

a precharge pull-down transistor connected between the buffer node and ground; and a buffer pull-down transistor connected to the respective global bit line, a gate of the buffer pull-down transistor being connected to the buffer node.

2. The multiple data rate memory of claim 1, wherein the local-to-global interface circuit further comprises a third local read buffer and fourth local read buffer, the third local read buffer being configured to control the state of a third global bit line in dependence upon the state of a second of the pair of local bit lines during the first memory access, and the fourth local read buffer being configured to control the state of a fourth global bit line in dependence upon the state of the second of the pair of local bit lines during the second memory access.

3. The multiple data rate memory of claim 2, wherein the third local read buffer and the fourth local read buffer each comprise a dynamic buffer that is enabled during the respective memory access, and wherein the dynamic buffer is configured to pulldown on the respective global bit line in dependence upon the state of the respective local bit line when the dynamic buffer is enabled.

4. The multiple data rate memory of claim 1, wherein the precharge pull-down transistor is configured to discharge the buffer node prior to the respective memory access and the clocked transistor is configured to be enabled during the respective memory access.

5. The multiple data rate memory of claim 1, wherein the local-to-global interface circuit is configured to control the state of a pair of first global bit lines in dependence upon the state of the pair of local bit lines during the first memory access, and to control the state of a pair of second global bit lines in dependence upon the state of the pair of local bit lines during the second memory access.

6. The multiple data rate memory of claim 5, wherein the local-to-global interface circuit comprises a local sense amplifier, the local sense amplifier being configured to control the state of the pair of first global bit lines in dependence upon the state of the pair of local bit lines during the first memory access and to control the state of the pair of second global bit lines in dependence upon the state of the pair of local bit lines during the second memory access.

7. The multiple data rate memory of claim 5, wherein the local-to-global interface circuit comprises a first local sense amplifier and a second local sense amplifier, the first local sense amplifier being configured to control the state of the pair of first global bit lines in dependence upon the state of the pair of local bit lines during the first memory access, and the second local sense amplifier being configured to control the state of the pair of second global bit lines in dependence upon the state of the pair of local bit lines during the second memory access.

8. The multiple data rate memory of claim 1, wherein the local-to-global interface circuit is configured to control the state of a first global bit line in dependence upon the state of a first of the pair of local bit lines during the first memory access, and to control the state of a second global bit line in dependence upon the state of the first of the pair of local bit lines during the second memory access.

9. The multiple data rate memory of claim 8, wherein the local-to-global interface circuit is further configured to control the state of a third global bit line in dependence upon the state of a second of the pair of local bit lines during the first memory access, and to control the state of a fourth global bit line in dependence upon the state of the second of the pair of local bit lines during the second memory access.

10. The multiple data rate memory of claim 8, wherein the local-to-global interface circuit is further configured to control the state of a third global bit line in dependence upon the state of a second of the pair of local bit lines during the first memory access, and to control the state of a fourth global bit line in dependence upon the state of the second of the pair of local bit lines during the second memory access and wherein the local-to-global interface circuit comprises a first local read buffer and a second local read buffer, the first local read buffer being configured to control the state of a first global bit line in dependence upon the state of the first of the pair of local bit lines during the first memory access and to control the state of the second global bit line in dependence upon the state of the first of the pair of local bit lines during the second memory access, and the second local read buffer being configured to control the state of a third global bit line in dependence upon the state of the second of the pair of local bit lines (during the first memory access and to control the state of the fourth global bit line in dependence upon the state of the second of the pair of local bit lines during the second memory access.

11. The multiple data rate memory of claim 8, wherein the local-to-global interface circuit is further configured to control the state of a third global bit line in dependence upon the state of a second of the pair of local bit lines during the first memory access, and to control the state of a fourth global bit line in dependence upon the state of the second of the pair of local bit lines during the second memory access and wherein the local-to-global interface circuit comprises a first local read buffer and a second local read buffer, the first local read buffer being configured to control the state of a first global bit line in dependence upon the state of the first of the pair of local bit lines during the first memory access and to control the state of the second global bit line in dependence upon the state of the first of the pair of local bit lines during the second memory access, and the second local read buffer being configured to control the state of a third global bit line in dependence upon the state of the second of the pair of local bit lines during the first memory access and to control the state of the fourth global bit line in dependence upon the state of the second of the pair of local bit lines during the second memory access and wherein the or each dynamic buffer comprises:

a first clocked transistor connected between the local bit line-dependent pull-up transistor and a first buffer node of the dynamic buffer;

a second clocked transistor connected between the local bit line-dependent pull-up transistor and a second buffer node of the dynamic buffer;

a first precharge pull-down transistor connected between the first buffer node and ground;

a second precharge pull-down transistor connected between the second buffer node and ground;

a first buffer pull-down transistor connected to a first global bit line, a gate of the first buffer pull-down transistor being connected to the first buffer node; and a second buffer pull-down transistor connected to a second global bit line, a gate of the second buffer pull-down transistor being connected to the second buffer node.

12. The multiple data rate memory of claim 8, wherein the local-to-global interface circuit is further configured to control the state of a third global bit line in dependence upon the state of a second of the pair of local bit lines during the first memory access, and to control the state of a fourth global bit line in dependence upon the state of the second of the pair of local bit lines during the second memory access and wherein the local-to-global interface circuit comprises a first local read buffer and a second local read buffer, the first local read buffer being configured to control the state of a first global bit line in dependence upon the state of the first of the pair of local bit lines during the first memory access and to control the state of the second global bit line in dependence upon the state of the first of the pair of local bit lines during the second memory access, and the second local read buffer being configured to control the state of a third global bit line in dependence upon the state of the second of the pair of local bit lines (during the first memory access and to control the state of the fourth global bit line in dependence upon the state of the second of the pair of local bit lines during the second memory access and wherein the or each dynamic buffer comprises:

a first clocked transistor connected between the local bit line-dependent pull-up transistor and a first buffer node of the dynamic buffer;

a second clocked transistor connected between the local bit line-dependent pull-up transistor and a second buffer node of the dynamic buffer;

a first precharge pull-down transistor connected between the first buffer node and ground;

a second precharge pull-down transistor connected between the second buffer node and ground;

a first buffer pull-down transistor connected to a first global bit line, a gate of the first buffer pull-down transistor being connected to the first buffer node; and a second buffer pull-down transistor connected to a second global bit line, a gate of the second buffer pull-down transistor being connected to the second buffer node; and wherein the first precharge pull-down transistor is configured to discharge the first buffer node prior to the first memory access, the second precharge pull-down transistor is configured to discharge the second buffer node prior to the second memory access, the first clocked transistor is configured to be enabled during the first memory access and the second clocked transistor is configured to be enabled during the second memory access.

13. The multiple data rate memory of claim 1, wherein each memory cell within a memory cell group is operatively connected to a single local read bit line.

14. The multiple data rate memory of claim 13, wherein the local-to-global interface circuit is configured to control the state of a first global bit line in dependence upon the state of the local read bit line during the first memory access, and to control the state of a second global bit line in dependence upon the state of the local read bit line during the second memory access.

15. The multiple data rate memory of claim 13, wherein the local-to-global interface circuit comprises a local read buffer, the local read buffer being configured to control the state of the first global bit line in dependence upon the state of the local read bit line during the first memory access and to control the state of the second global bit line in dependence upon the state of the local read bit line during the second memory access.

16. The multiple data rate memory of claim 15, wherein the or each dynamic buffer comprises:

a first clocked transistor connected between the local bit line-dependent pull-up transistor and a first buffer node of the dynamic buffer;

a second clocked transistor connected between the local bit line-dependent pull-up transistor and a second buffer node of the dynamic buffer;

a first precharge pull-down transistor connected between the first buffer node and ground;

a second precharge pull-down transistor connected between the second buffer node and ground;

a first buffer pull-down transistor connected to a first global bit line, a gate of the first buffer pull-down transistor being connected to the first buffer node; and a second buffer pull-down transistor connected to a second global bit line, a gate of the second buffer pull-down transistor being connected to the second buffer node.

17. The multiple data rate memory of claim 13, wherein the local-to-global interface circuit comprises a local read buffer, the local read buffer being configured to control the state of the first global bit line in dependence upon the state of the local read bit line during the first memory access and to control the state of the second global bit line in dependence upon the state of the local read bit line during the second memory access and wherein the local read buffer comprises a dynamic buffer that is enabled during the respective memory access, and wherein the dynamic buffer is configured to pulldown on the respective global bit line in dependence upon the state of the local read bit line when the dynamic buffer is enabled.

18. The multiple data rate memory of claim 13, wherein the local-to-global interface circuit is configured to control the state of a first global bit line in dependence upon the state of the local read bit line during the first memory access, and to control the state of a second global bit line in dependence upon the state of the local read bit line during the second memory access and wherein the local-to-global interface circuit comprises a first local read buffer and a second local read buffer, the first local read buffer being configured to control the state of a first global bit line in dependence upon the state of the local read bit line during the first memory access, and the second local read buffer is configured to control the state of the second global bit line in dependence upon the state of the local read bit line during the second memory access.

19. The multiple data rate memory of claim 13, wherein the local-to-global interface circuit is configured to control the state of a first global bit line in dependence upon the state of the local read bit line during the first memory access, and to control the state of a second global bit line in dependence upon the state of the local read bit line during the second memory access and wherein the local-to-global interface circuit comprises a first local read buffer and a second local read buffer, the first local read buffer being configured to control the state of a first global bit line in dependence upon the state of the local read bit line during the first memory access, and the second local read buffer is configured to control the state of the second global bit line in dependence upon the state of the local read bit line during the second memory access and wherein the first local read buffer and the second local read buffer each comprise a dynamic buffer that is enabled during the respective memory access, and wherein the dynamic buffer is configured to pulldown on the respective global bit line in dependence upon the state of the local read bit line when the dynamic buffer is enabled.

20. The multiple data rate memory of claim 13, wherein the local-to-global interface circuit is configured to control the state of a first global bit line in dependence upon the state of the local read bit line during the first memory access, and to control the state of a second global bit line in dependence upon the state of the local read bit line during the second memory access and wherein the local-to-global interface circuit comprises a local read buffer, the local read buffer being configured to control the state of the first global bit line in dependence upon the state of the local read bit line during the first memory access and to control the state of the second global bit line in dependence upon the state of the local read bit line during the second memory access.

21. The multiple data rate memory of claim 1, wherein the memory comprises:
   a first memory cell group comprising a first plurality of memory cells that are each operatively connected to at least one first group local bit line;
   a second memory cell group comprising a second plurality of memory cells that are each operatively connected to at least one second group local bit line;
   the at least one first group local bit line and the at least one second group local bit line both being connected to a local-to-global interface circuit;
   wherein the local-to-global interface circuit is configured to control the state of at least one first global bit line in dependence upon the state of either the at least one first group local bit line or the at least one second group local bit line during the first memory access and to control the state of at least one second global bit line in dependence upon the state of either the at least one first group local bit line or the at least one second group local bit line during the second memory access.

22. The multiple data rate memory of claim 21, wherein the local-to-global interface circuit comprises a first local read buffer and a second local read buffer, the first local read buffer being configured to control the state of a first global bit line in dependence upon the state of a first group local bit line or a second group local bit line during the first memory access, and the second local read buffer is configured to control the state of the second global bit line in dependence upon the state of either a first group local bit line or a second group local bit line during the second memory access.

23. The multiple data rate memory of claim 22, wherein the first local read buffer and the second local read buffer each comprise a dynamic buffer that is enabled during the respective memory access, and wherein the dynamic buffer is configured to pulldown on the respective global bit line in dependence upon the state of either first group local bit line or the second group local bit line when the dynamic buffer is enabled.

24. The multiple data rate memory of claim 22, wherein the first local read buffer and the second local read buffer each comprise a dynamic buffer that is enabled during the respective memory access, and wherein the dynamic buffer is configured to pulldown on the respective global bit line in dependence upon the state of either first group local bit line or the second group local bit line when the dynamic buffer is enabled wherein each dynamic buffer comprises:
   a first group local bit line-enabled pull-up transistor and a second group local bit line-enabled pull-up transistor connected in parallel; and
   the clocked transistor connected between the first and second group local bit line-dependent pull-up transistors and a buffer node of the dynamic buffer.

25. The multiple data rate memory of claim 22, wherein the first local read buffer and the second local read buffer each comprise a dynamic buffer that is enabled during the respective memory access, and wherein the dynamic buffer is configured to pulldown on the respective global bit line in dependence upon the state of either first group local bit line or the second group local bit line when the dynamic buffer is enabled wherein each dynamic buffer comprises:
   a first group local bit line-enabled pull-up transistor and a second group local bit line-enabled pull-up transistor connected in parallel; and
   the clocked transistor connected between the first and second group local bit line-dependent pull-up transistors and a buffer node of the dynamic buffer; and
   wherein the precharge pull-down transistor is configured to discharge the buffer node prior to the respective memory access and the clocked transistor is configured to be enabled during the respective memory access.

* * * * *